United States Patent [19]  
Juge

[11] Patent Number: 4,906,921  
[45] Date of Patent: Mar. 6, 1990

[54] STRUCTURE AND PROCESS FOR TESTING INTEGRATED CIRCUITS PERMITTING DETERMINATION OF THE PROPERTIES OF LAYERS

[75] Inventor: André Juge, Saint Egreve, France

[73] Assignee: SGS-Thompson Microelectronics S.A., Gentilly, France

[21] Appl. No.: 216,164

[22] Filed: Jul. 7, 1988

[30] Foreign Application Priority Data

Jul. 7, 1987 [FR] France ............................. 87 09903

[51] Int. Cl.⁴ ..................... G01R 19/08; G01R 31/28
[52] U.S. Cl. ............................. 324/158 R; 324/158 D
[58] Field of Search ............ 324/158 D, 158 R, 73 R, 324/158 F

[56] References Cited

U.S. PATENT DOCUMENTS

| 3,974,443 | 8/1976 | Thomas | 364/64 |
| 4,467,400 | 8/1984 | Stopper | 361/403 |
| 4,479,088 | 10/1984 | Stopper | 324/73 R |
| 4,486,705 | 12/1985 | Stopper | 324/73 R |
| 4,672,314 | 6/1987 | Kokkas | 324/158 R |

FOREIGN PATENT DOCUMENTS 0175870 4/1986 European Pat. Off. .
0201945 11/1986 European Pat. Off. .
2296852 12/1975 France .

OTHER PUBLICATIONS

Baker et al, IBM Technical Disclosure Bulletin, vol. 14, No. 12, p. 3707, May 1972.

Primary Examiner—Ernest F. Karlsen
Assistant Examiner—Edward Urban
Attorney, Agent, or Firm—Lowe, Price, LeBlanc, Becker & Shur

[57] ABSTRACT

The instant invention relates to a test structure for an integrated circuit for determining the incidence of various conduction effects on given layers and separating the surface effects from the wedge effects and the periphery effects into two perpendicular directions, wherein test patterns of determined shapes are incorporated into elementary components comprising the given layers transversely polarized, further comprising at least four test patterns (11, 13, 15, 17) in which the given layers are delimited according to four rectangles, each of which has a common dimension with another one, that is, those four rectangles have only two length values (YD) and two width values (XD).

4 Claims, 2 Drawing Sheets

STRUCTURE AND PROCESS FOR TESTING INTEGRATED CIRCUITS PERMITTING DETERMINATION OF THE PROPERTIES OF LAYERS

BACKGROUND OF THE INVENTION

In the field of the manufacturing of integrated circuits, processing of batches of semiconductor wafers are conventionally carried out, each integrated circuit constituting a small area, generally rectangular, of each wafer. A plurality of identical patterns are repeated on the same wafer. However, in order to be able to check that there was no drift during the manufacturing process with respect to predetermined parameters, one generally provides for some free rectangles formed in the wafer for inserting test patterns designed for quickly checking the features typical to the wafer and to the specific manufacturing batch. Those test patterns may serve for the checking of the processing parameters when the wafer is completed, before being put into a casing, or for carrying out tests during intermediary steps of the manufacturing process, either for correcting the defects already existing in the previous steps, or for deciding whether the wafer is to be discarded before carrying out further manufacturing steps. In any case, the results of this test are used for determining the specific setting of the parameters of the following batch which must theoritically be processed with the same method.

Among the major parameters that one wishes to determine, are the parameters relative to the conduction per surface unit. Indeed, as it is often the case for an integrated circuit, the various layer portions intervene with respect to their surface features.

The physical effects taking part in the current flowing in the semiconductive layers are all the more complex as the designed sizes of those layers are smaller. While the surface of the elementary components (diodes, transistors, resistors) is reduced because of the advancement of the manufacturing technologies, particularly the photolithography, the physical surface effects (current, capacitors) further present the following effects:

periphery effects for elongated and narrow patterns,
wedge effects for square patterns.

On the other hand, an unavoidable drift occurs while manufacturing of those layers, between the design of the patterns and their implantation into silicon.

This drift directly depends upon the manufacturing process. It may be positive or negative. It is also scattered because of the variations of the manufacturing parameters.

This drift includes the inaccuracies in the implementation of all the steps of a given process: the implementation of the masks (positioning margin), the selection levels (over-etching of the resins in case of a resin mask, lateral extensions of oxide in the LOCOS technologies), and the steps of diffusion or implantation/annealing (lateral diffusions).

It is essential in any manufacturing process to be able to identify and distinguish those various effects (surface, perimeter, wedge) both in nominal value and in scattering, and to be able to study their evolution as a function of time. For this purpose, physical measurements carried out by means of microscopy or spreading resistance analysis permit occasional determination of those effects, but they are too complex for a statistical follow-up.

The use of an electrical test process carried out on suitable patterns permits a faster and more utilizable approach of those effects, since it provides for results that are of great interest for the circuit designers.

Those results are shown in the form of particular electrical parameters associated with geometrical parameters. The following units and notations are usual:

| Electric variable | Surface | Periphery | Wedges |
|---|---|---|---|
| Current densities | $A/\mu m^2$ | $A/\mu m$ | A/wedge |
| Junction capacitors or oxide capacitors | $f/\mu m^2$ | $f/\mu m$ | f/wedge |
| Diffusion charges | $C/\mu m^2$ | $C/\mu m$ | C/wedge |

(the abbreviation $\mu m$ stands for micrometer).

Those information are compulsory for the design since they permit the optimization of the elementary component design (transistors, diodes, etc.) within a given technology, resulting in a considerable gain in time and costs because of the substantial decrease in the number of tests carried out before reaching the desired optimum.

On the other hand, they are a complementary analysis tool for the teams in charge of optimizing the manufacturing processes.

Test patterns such as illustrated in FIGS. 1A and 1B, are currently used.

FIG. 1A shows a first test pattern. In this figure, the frame 1 drawn in solid lines represents the drawing of a mask used for forming or delimiting a layer and the frame 2 drawn in dotted lines represents the pattern resulting from this operation.

FIG. 1B shows a second test pattern associated with the first one. Similarly, the frame 3 shows a layer delimitation mask and the frame 4 drawn in dotted lines shows the obtained structure.

The structures of FIGS. 1A and 1B are specific in that they have periphery/surface ratios of unlike values. For using those structures, one introduces them into an elementary electrical component of an integrated circuit (resistor, transistor, etc.), so that a current is forced to flow perpendicularly to said layers. Under the same voltage conditions, one measures the currents I1 and I2 appearing at the terminals of said layers, in direct current or alternating current according to the type of structure. Once those currents I1 and I2 have been measured, and the designed surfaces SD1 and SD2 of the two patterns as well as peripheries PD1 and PD2 of those patterns being known, one determines the current densities JS and JP respectively associated with the surface and periphery effects of both structures with the following equations:

$$JS \times SD1 + JP \times PD1 = I1$$

$$JS \times SD2 + JP \times PD2 = I2$$

It will be noted that for the writing of both equations, the wedge effects have been neglected.

This method presents some drawbacks. As a matter of fact, one can notice in the obtained results an important inaccuracy which is due to the fact that the wedge effects have not been taken into account. This inaccuracy does not permit the application of results to the design optimization of small-size components, wherein the wedge effects are preponderant. Furthermore, it involves a systematic and an a priori non-appraisable error in the design of components having large sizes. This method does not permit either to distinguish the effects in X and in Y of a periphery.

One object of the instant invention is to provide for a new test pattern structure permitting to supply, by means of simple and fast calculations, the voltage densities associated with the surface effects, X periphery, Y periphery and wedge effects for layer portions of an integrated circuit.

BRIEF DESCRIPTION OF THE INVENTION

To achieve this object, the instant invention provides for a test structure for an integrated circuit for determining the incidence of the various conduction effects in the given layers and separating the surface effects from the wedge and periphery effects into two perpendicular directions wherein test patterns with predetermined shapes are incorporated into the elementary components comprising said layers thickwise polarized, comprising at least four test patterns wherein said layers are delimited in accordance with four rectangles, each of which being deducted from the others by a common dimension, that is, those four rectangles have only two length sizes and two width sizes.

A test method according to the instant invention comprises the following steps:

connecting together to a first terminal the first contacts of the components associated with a first face of the test patterns;

connecting the other contacts of the components associated with a second face of the patterns to a second terminal through measurement means of an electrical parameter;

applying a current supply between the first and second terminals;

measuring the current flowing through each test pattern;

calculating therefrom the surface effects relative to the X and Y periphery, as well as the wedge effects.

BRIEF DESCRIPTION OF THE DRAWINGS

Other features and advantages of the instant invention will clearly appear in the following detailed description of preferred embodiments, in connection with the attached drawings, wherein:

In FIGS. 2A to 2D, one can see four mask designs, 11 to 17, arranged in a square and the resulting diffusion patterns 12 to 18. As shown in the figures, each of the mask is derived from the two adjacent masks by the fact it has the same sizes in X or in Y. Thus, if, for each mask pattern, one indicates by XD the designed X size and by YD the designed Y size, one obtains XD1=XD3, XD2=XD4, YD1=YD2 and YD3=YD4. It will be noted that:

Figure 1A:
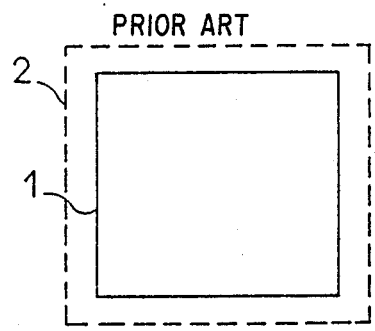
FIGS. 1A and 1B, referred to above illustrate the drawbacks of the test patterns according to the prior art.
Figure 1B:
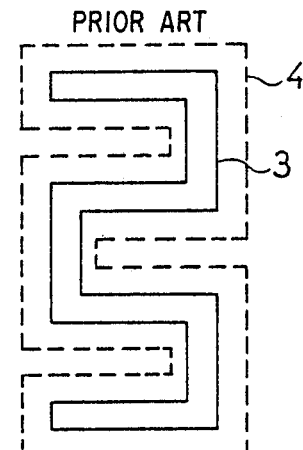
Figure 2A:
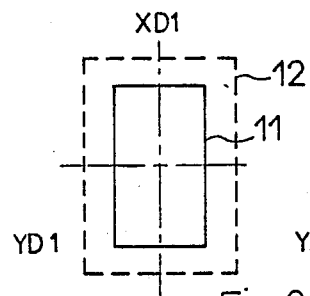
FIGS. 2A to 2D show test patterns according to the instant invention.
Figure 2B:
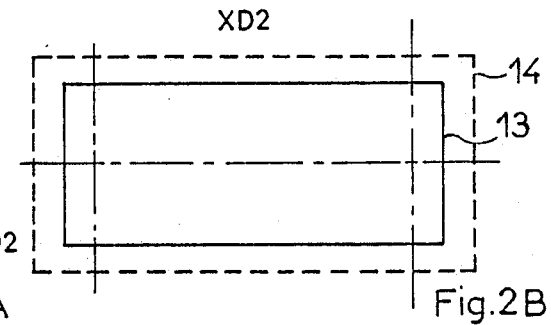
Figure 2C:
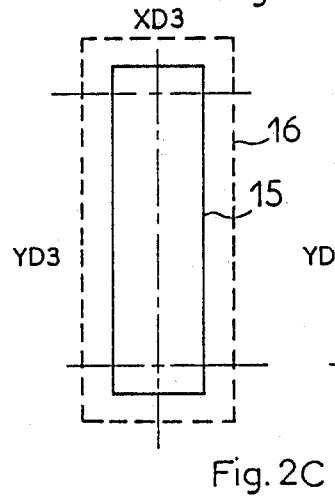
Figure 2D:
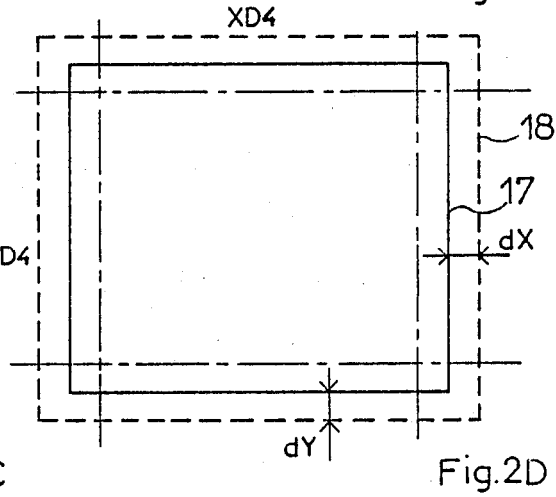

each of the patterns presents surface, periphery and wedge effects, with a different weighting in the overall effect which is observed (vertical current or charge capacitance), the real surfaces and peripheries of each pattern after manufacturing are different from the designed surfaces and peripheries; those differences are, a priori, undetermined, the hypothesis of a thin layer is verified, that is, the depth XJ of the involved layer remains minor with respect to the length and the width of the minimum pattern (about 10% of the smallest size or less).

For all the test patterns 11 to 17, the electric variable, the unit values of which are to be determined, is measured under identical conditions (voltage, temperature, etc.) so that the discrepancies that are observed be not attribuable to a shape change. For example, it will be possible to incorporate the four test patterns disclosed in FIGS. 2A to 2D into emitters of vertical NPN transistors and to adopt the scheme shown in FIG. 3 wherein each of the test patterns 11 to 17 is incorporated as an emitter pattern of a transistor 21 to 27. The emitters of those transistors are interconnected and are grounded through a current source 30. This configuration permits insuring that the base-emitter junctions of the four patterns are polarized:

under the same voltage, to a well-determined level of total current, assigned by the current source, so that the voltage losses caused by the parasitic access resistances to the junction are negligible. The polarization of the junctions through a voltage supply would permit to warrant the equipotentiality of the base-emitter junctions, but not the current level. All the collectors of those transistors are grounded through ammeters 31 to 37. Ammeters 32 to 38 are designed for checking the base current of each transistor.

If all the collector currents are measured, the relations between the measured currents I1, I2, I3, I4 and the elementary components of the current can be simply illustrated in the following matrix form:

$$\begin{vmatrix} I1 \\ I2 \\ I3 \\ I4 \end{vmatrix} = \begin{vmatrix} 4 \ XD1 \times YD1 & 2YD1 & 2XD1 \\ 4 \ XD2 \times YD2 & 2YD2 & 2XD2 \\ 4 \ XD3 \times YD3 & 2YD3 & 2XD3 \\ 4 \ XD4 \times YD4 & 2YD4 & 2XD4 \end{vmatrix} \times \begin{vmatrix} Jwedge \\ JS \\ JPX \\ JPY \end{vmatrix}$$

$$[I] = [G] \times [J],$$

where I is the base or collector current and J is the corresponding current density.

In this equation, I1, I2, I3, I4 indicate the measured currents (I=IC or IB).

The various elements of matrix G are weighting coefficients associated with the elementary fluxes of the collector or base current (wedges, surface and periphery in X and in Y); those values are known from the design of the masks.

The vector J is the current density vector to be determined. Jwedge is the flux associated with one wedge, JS is the surface flux in amperes per micrometer$^2$, JPX and JPY are the fluxes associated with the edges in X and Y, measured in amperes per micrometer.

Those fluxes incorporate all the edge effects such as over-etching, lateral diffusion, variation in the base depth at the emitter periphery. Those edge effects are different depending on whether the collector current or the base current is considered.

According to one advantage of the instant invention and because of the specific choice of the sizes of the four rectangles, it is not necessary to invert the matrix G. As a matter of fact, taking into account that $XD1=XD3$, $YD1=YD2$, $XD2=XD4$ and $YD3=YD4$, one directly obtains the unknown JS by decomposing the larger pattern (FIG. 2D) into four areas, three of which are common to the patterns of FIGS. 2A, 2B and 2C. Thus, $$I4-I3-I2+I1=JS\times(SD4-SD3-SD2+SD1)$$

wherein SD1, SD2, SD3, SD4 are the designed surfaces of the four patterns.

The surface unit flux of JS is easily obtained:
without knowing, a priori, the differences between real sizes and designed sizes,
by eliminating the wedge effects.

JPX and JPY are respectively determined by the following relations:

$$JPX=[I4-I2-JS\times(SD4-SD2)]/[2\times(YD4-YD2)]$$

$$JPY=[I4-I3-JS\times(SD4-SD3)]/[2\times(XD4-XD3)]$$

Jwedge is determined from the measure of I1 and from the other parameters JS, JPX, JPY.

$$I1=4\times Jwedge+2XD1\ JPY+2YD1\ JPX+XD1\ YD1\ JS$$

from which:

$$Jwedge=\tfrac{1}{4}[I1-2XD1\ JPY-2YD1\ JPX-XD1\ YD1\ JS]$$

Finally, one determines the equivalent differences dX and dY between the real sizes and the designed sizes, separately, according to axes X and Y.

Any current without a wedge effect is written in the following form:

$$\begin{aligned}I-4\,Jwedge &= JS\times S+JPX\,2XD+JPY\,2YD\\&= JS\times S\,[1+(JPX\,2YD+JPY\,2XD)/(JS\times S)]\end{aligned}$$

The equivalent differences dX and dY are determined by identifying the preceding relation from the following relation:

$$\begin{aligned}I-4\,J\,\text{wedge} &= JS\times[S+dX\times 2YD+dY\times 2XD]\\&= JS\times S\,[1+dX\times(2YD/S)+dY\times(2XD/S)]\end{aligned}$$

from where:
dX = JPX/JS
dY = JPY/JS.

Therefore, the advantages of the instant invention are more particularly as follows:
the surface and periphery values are determined from the measured values by using only differences in the designed dimensions;
the differences between the real dimensions and the designed dimensions do not need to be known, a priori, but also one can determine the equivalent associated parameters:
without making simplifying hypothesis (such as the setting aside of the wedge effects),
separately on the X and Y axes,
locally on the chip, whereby one takes into account the spatial scattering which is unavoidable on a given wafer;
if the pattern 11 is designed in conformity with the minimum rules of the manufacturing process, the electric variables of any new component may be provided for by superposition of the unit sizes, which permits optimization of the component design with reference to the desired electric performance.

The desired global electric value is simply determined by:

| $I-$ | $4\times Jwedge +$ | $2JPX\times YD +$ | $2JPY\times XD +$ | $JS\times XD\times YD$ |
|---|---|---|---|---|
| | Contribution of angles | Contribution of periphery in $X$ | Contribution of periphery in $Y$ | Contribution of surface | or also:

| $I =$ | $I1 + 2\,JPX\times$ | $(Y-YD1) + 2JPY\times$ | $(XD-XD1) + JS\,(XD\times$ | $YD-XD1)$ |
|---|---|---|---|---|
| | Contribution of pattern 11 | Contribution of periphery in $X$ (without pattern 11) | Contribution of periphery in $Y$ (without pattern 11) | Contribution of surface (without pattern 11 |

The principle of the symmetry of the structure patterns as well as the measurement method are applicable to the assessment of surface and periphery values of any type of component such as:
the current densities of bipolar transistors:
of the base/emitter junction
of the base/collector junction
the effective lengths and widths of MOS transistors,
the oxide or junctions capacitors,
the resistors (vertical collector well, etc).

Each time a physical effect can be described in the form of an elementary particle flux through a plane surface into a thin volume, associated with a periphery flux at the limits of this surface, the instant invention can be used.

In the field of semiconductors for which the manufacturing conditions are unavoidably scattered, the invention, due to its flexibility of performance and its accuracy, permits a statistical follow-up of unit electric variables associated with the elementary physical phenomena such as the current fluxes or the charge fluxes in close relationship with the manufacturing conditions.

Figure 4A:
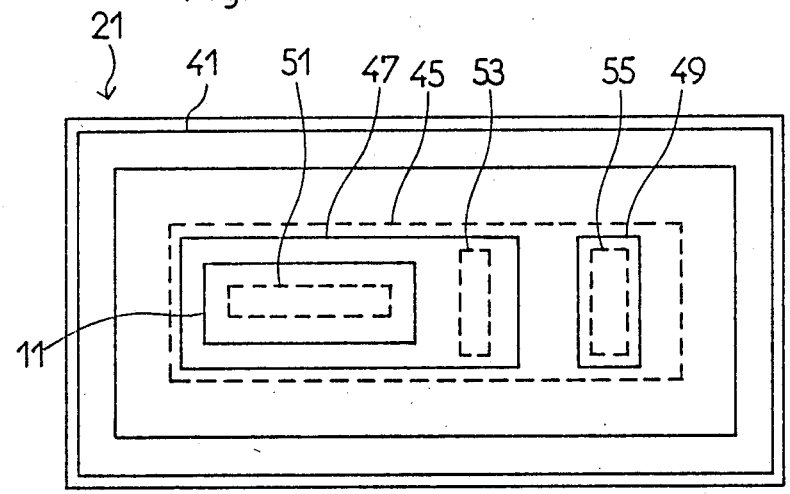
FIGS. 4A and 4B respectively show a top view and a side view of a test pattern according to the invention incorporated into a NPN transistor, constituting a preferred embodiment of the instant invention.
Figure 4B:
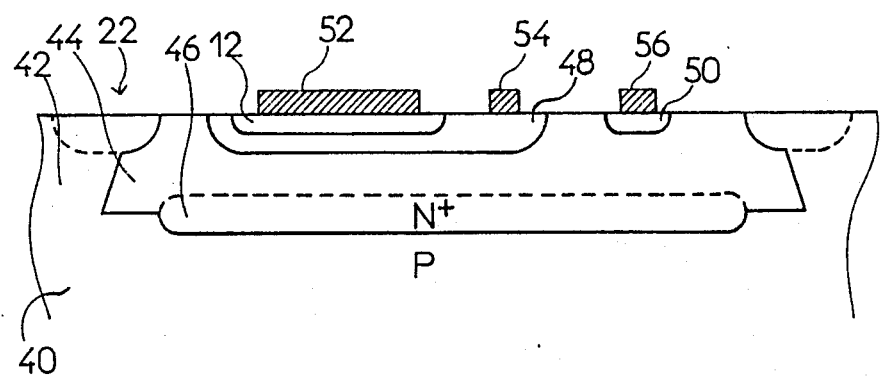

FIGS. 4A and 4B more precisely show how one of the test patterns, for example pattern 11, may be incorporated into a transistor in order to serve as a test of the conduction characteristics perpendicular to the surface of an emitter layer. FIG. 4A shows a top view of a mask design and FIG. 4B is a side view of the corresponding structure. Therefore, in FIG. 4A, components labelled with an odd reference number indicate an opening of the mask whereas in FIG. 4B, the areas labelled with an even reference number of one unit higher than the reference in FIG. 4A show the layers obtained by the corresponding mask design. Therefore, the set of masks 21 shown in FIG. 4A supplies the structure 22 of FIG. 4B. The layer that one more particularly wishes to test is the emitter layer 12 corresponding to the mask design 11.

Transistor NPN 22 is shown in the field of a specific technology on a P-substrate 40, the active components being surrounded with a P-area 42 for forming the boxes of an epitaxial N-layer 44; at the bottom of the boxes is arranged a buried layer 46 of the N+ type. In this buried layer, one base area 48 and emitter and collector areas 12 and 50 are successively diffused. Finally, emitter, base and collector metallizations 52, 54 and 56 are formed on the corresponding contact areas.

The conduction in the emitter layer 12 is performed perpendicularly to the surface of this layer towards the buried layer 46 then towards the collector contact area 50 and towards the collector metallization 56. Possibly, in certain structures, a collector well permits to attain the buried layer 46.

Thus, according to the instant invention, four transistors are used such as the one disclosed in FIGS. 4A and 4B, the shapes of the emitters corresponding to the shapes shown in FIGS. 2A to 2D.

Figure 3:
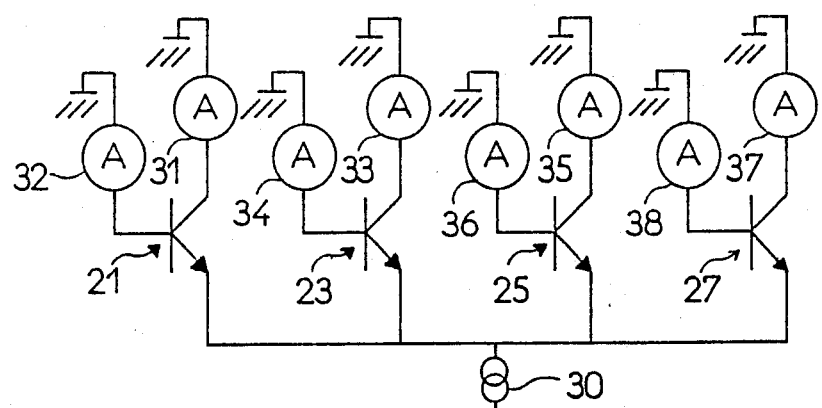
FIG. 3 schematically shows a connection method for test patterns according to the instant invention for permitting a simple measurement of the surface conduction parameter of the layers involved.

It must be pointed out that the specific application of FIG. 3 and FIGS. 4A and 4B represents only one preferred embodiment of the test structure according to the instant invention. Instead of measuring the current flowing through the layers, one could possibly, for example, for testing gate oxides of MOS-type structures, apply voltage differences and measure capacitances. Likewise, one can provide for measurements in alternative current if this method proves wishable.

The following equations sum up the method which permits to obtain the wished parameters from the measurements carried out on test patterns according to the invention, as well as the correlations between the unavoidable uncertainties in measurements and the final uncertainities relating to the obtained parameters.

Surface current density $$JS = (I4 - I3 - I2 + I1) / (SD4 - SD3 - SD2 + SD1)$$

$$dJS/JS = (dI4 + dI3 + dI2 + dI1) / (I4 - I3 - I2 + I1)$$

X-periphery current density and absolute uncertainty $$JPX = [I4 - I2 - JS \times (SD4 - SD2)] / [2(YD4 - YD2)]$$

$$JPX = [(I4 - I2)(SD1 - SD3) + (I3 - I1)(SD4 - SD2)] / [2(YD4 - YD2)(SD4 - SD3 - SD2 + SD1)]$$

$$dJPX = [(dI4 + dI2)(SD3 - SD1) + (dI3 + dI1)(SD4 - SD2)] / [2(YD4 - YD2)(SD4 - SD3 - SD2 + SD1)]$$

Y-periphery current density and absolute uncertainty $$JPY = [I4 - I3 - JS \times (SD4 - SD3)] / [2(XD4 - XD3)]$$

$$JPY = [(I4 - I3)(SD1 - SD2) + (I2 - I1)(SD4 - SD3)] / [2(XD4 - XD3)(SD4 - SD3 - SD2 + SD1)]$$

$$dJPY = [(dI4 + dI3)(SD2 - SD1) + (dI2 - dI1)(SD4 - SD3)] / [2(XD4 - XD3)(SD4 - SD3 - SD2 + SD1)]$$

Wedge current density and absolute uncertainty $$Jwedge = 0.25 \times [I1 - 2XD1\, JPY - 2YD1\, JPX - XD1\, YD1\, JS]$$

$$dJwedge = 0.25 \times [dI1 \times A1 + dI2 \times A2 + dI3 \times A3 + dI4 \times A4]$$

with:

$$A1 = [1 - SD1/(SD4 - SD3 - SD2 + SD1)]$$

$$A2 = YD1/(YD4 - YD2) + SD1/(SD4 - SD3 - SD2 + SD1)$$

$$A3 = XD1/(XD4 - XD3) + SD1/(SD4 - SD3 - SD2 + SD1)$$

$$A4 = XD1/(XD4 - XD3) + YD1/(YD4 - YD2) + SD1/(SD4 - SD3 - SD2 + SD1)$$

Extension of equivalent surface in X and absolute uncertainty $$dX = JPX / JS$$

$$d(dX) = [(SD4 - SD3 - SD2 + SD1) / 2(YD4 - YD2)] \times [1/(I4 - I3 - I2 + I1)^2] \times [(I3 - I1)(dI4 + dI2) + (I4 - I2)(dI1 + dI3)]$$

Extension of equivalent surface in Y and absolute uncertainty $$dY = JPY/JS$$

$$d(dY) = [(SD4 - SD3 - SD2 + SD1) / 2(XD4 - XD3)] \times [1/(I4 - I3 - I2 + I1)^2] \times [(I2 - I1)(dI4 + dI3) + (I4 - I3)(dI1 + dI2)]$$

I claim:

1. A test structure in an integrated circuit for determining the incidence of various conduction effects on a given layer and separating the surface effects from the wedge effects and periphery effects into two perpendicular directions, wherein test patterns comprising a separate portion of said given layer are incorporated into elementary components, each comprising a portion of said layer which is transversely polarized, comprising an arrangement including four test patterns (11, 13, 15, 17) in which said test patterns in said layer are delimited according to four separate rectangles, each of which results from the other by a common dimension, that is, those four rectangles have only two length values (YD) and two width values (XD).

2. A test structure of an integrated circuit layer for determining the incidence of the manufacturing process on components comprising portions of said layer, including four elementary components, each one comprising an electrically separate portion of said layer, said portions of said layer being of rectangular shape and each side of each rectangular shape having a length in common with the length of one side of only one other of said four rectangular elementary components.

3. A test process using a test structure including four elementary components, each one comprising a separate portion of a layer of an integrated circuit layer, said portions of said layer being of rectangular shape and each pair of said portions having a common dimension wherein each first face of each of said separate layer portions is associated with a respective first contact of the component including the layer portion and each second face of each of said separate layer portions is associated with a respective second contact of the component including the layer portion, comprising the steps of;

interconnecting the first contact to a first terminal;
connecting each second contact to a second terminal through measurement means for measuring an electrical parameter;
applying an electric supply source between said first and second terminals;
measuring the electrical parameters supplied by said supply source; and
deducing therefrom the surface, wedge, and periphery effects in orthogonal directions.

4. In a test structure for an integrated circuit layer, the improvement comprising four elementary components, each said elementary component being of a rectangular shape, each side of each rectangular shape having a length in common with the length of one side of only one other of said four rectangular elementary components.

* * * * *